(12) United States Patent
Sahu et al.

(10) Patent No.: US 11,303,284 B1
(45) Date of Patent: Apr. 12, 2022

(54) LOW-POWER FRACTIONAL ANALOG PLL WITHOUT FEEDBACK DIVIDER

(71) Applicant: TEXAS INSTRUMENTS INCORPORATED, Dallas, TX (US)

(72) Inventors: Debapriya Sahu, Karnataka (IN); Rittu Sachdev, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/375,997

(22) Filed: Jul. 14, 2021

Related U.S. Application Data

(63) Continuation of application No. 17/139,584, filed on Dec. 31, 2020, now Pat. No. 11,095,293.

(51) Int. Cl.
*H03L 7/089* (2006.01)
*H03L 7/099* (2006.01)
*H03L 7/08* (2006.01)

(52) U.S. Cl.
CPC .......... *H03L 7/0891* (2013.01); *H03L 7/0802* (2013.01); *H03L 7/099* (2013.01)

(58) Field of Classification Search
CPC .............................. H03L 7/0891; H03L 7/099
See application file for complete search history.

(56) References Cited

U.S. PATENT DOCUMENTS

| | | | | |
|---|---|---|---|---|
| 6,307,906 B1 * | 10/2001 | Tanji | .................... | H03D 13/004 375/375 |
| 6,310,521 B1 * | 10/2001 | Dalmia | .................. | H03L 7/087 327/156 |
| 6,907,374 B1 * | 6/2005 | Tsyrganovich | ....... | H03M 3/388 702/107 |
| 7,064,591 B1 * | 6/2006 | Humphreys | ............ | H03L 7/193 327/156 |
| 7,486,145 B2 * | 2/2009 | Floyd | .................... | H03L 7/1974 327/115 |
| 9,035,682 B2 * | 5/2015 | Gailus | ................... | H03L 7/1974 327/156 |
| 10,063,365 B1 * | 8/2018 | Ribo | ...................... | H04L 7/005 |
| 10,236,895 B1 * | 3/2019 | Rogers | .................... | H03L 7/081 |
| 2005/0008113 A1 * | 1/2005 | Kokubo | .................... | G06F 1/04 375/376 |
| 2006/0013349 A1 * | 1/2006 | Koh | ....................... | H03L 7/0891 375/376 |
| 2006/0067454 A1 * | 3/2006 | Camuffo | ................. | H03L 7/193 375/376 |

(Continued)

*Primary Examiner* — Adam D Houston
(74) *Attorney, Agent, or Firm* — Charles F. Koch; Charles A. Brill; Frank D. Cimino

(57) ABSTRACT

An integrated circuit device is provided. In some examples, the integrated circuit device includes a first re-timer configured to receive a reference clock signal and a voltage controlled oscillator (VCO) output signal, and the first re-timer is configured to provide a first re-timed clock signal in response to the reference clock signal and the VCO output signal. A multiplexer receives the first re-timed clock signal and provides a feedback clock signal. A phase frequency detector receives the feedback clock signal and the reference clock signal and provides an error signal in response to the feedback clock signal and the reference clock signal. A VCO receives a voltage signal based on the error signal, and the VCO is configured to provide the VCO output signal in response to the voltage signal.

15 Claims, 7 Drawing Sheets

(56) References Cited

U.S. PATENT DOCUMENTS

| | | | |
|---|---|---|---|
| 2010/0090731 A1* | 4/2010 | Casagrande | H03C 3/0958 327/148 |
| 2011/0006936 A1* | 1/2011 | Lin | H03L 7/085 341/143 |
| 2011/0019767 A1* | 1/2011 | Lamanna | H04L 7/0331 375/295 |
| 2012/0242384 A1* | 9/2012 | Kato | H03L 7/097 327/157 |
| 2014/0070857 A1* | 3/2014 | Huang | H03L 7/081 327/156 |
| 2014/0218080 A1* | 8/2014 | Choke | H04B 5/0056 327/148 |
| 2015/0155877 A1* | 6/2015 | Yang | H03L 7/197 327/157 |
| 2015/0200677 A1* | 7/2015 | Ainspan | H03L 7/0992 327/158 |
| 2015/0263742 A1* | 9/2015 | McLaurin | H03L 7/23 327/158 |
| 2016/0049947 A1* | 2/2016 | Adachi | H03L 7/1976 327/159 |
| 2016/0305835 A1* | 10/2016 | Kollias | G01L 9/12 |
| 2016/0380752 A1* | 12/2016 | Ahmad | H03L 7/085 327/158 |
| 2017/0141857 A1* | 5/2017 | Casagrande | H03F 3/245 |
| 2018/0175865 A1* | 6/2018 | Gu | H03L 7/099 |
| 2018/0254882 A1* | 9/2018 | Bogdan | H03L 7/0995 |
| 2019/0214999 A1* | 7/2019 | Yu | H03L 7/087 |
| 2019/0334529 A1* | 10/2019 | Huang | H03L 7/181 |
| 2020/0004990 A1* | 1/2020 | Kurd | G06F 1/28 |
| 2020/0195260 A1* | 6/2020 | Sato | H03L 7/1976 |
| 2020/0195261 A1* | 6/2020 | Khoury | H03B 5/1265 |
| 2020/0266806 A1* | 8/2020 | Nakajima | H03K 3/037 |
| 2020/0350919 A1* | 11/2020 | Marcu | H03L 7/099 |
| 2020/0373927 A1* | 11/2020 | Liang | H03L 7/18 |

* cited by examiner

LOW-POWER FRACTIONAL ANALOG PLL WITHOUT FEEDBACK DIVIDER

CROSS-REFERENCE TO RELATED APPLICATION

This application is a continuation of U.S. patent application Ser. No. 17/139,584 filed on Dec. 31, 2020.

BACKGROUND

In battery powered devices, the battery life depends on the consumption of power by the various systems within the device. Wireless devices that can transmit and/or receive may have, for example, a signal chain and local oscillator (LO) systems. The signal chain may include filters, amplifiers, analog to digital converters, and other components. While reducing the power consumed by these devices in the signal chain of the wireless device is one area to conserve power, the various components of a LO system of the wireless device also consume power that, if conserved, can also extend battery life.

One component of a LO may be a phase lock loop (PLL). PLLs have a wide variety of uses from simple clock clean-up circuits to LOs for high frequency radio communication links such as those used in wireless connections. PLLs compare the phase of a reference signal to the phase of an adjustable feedback signal. The comparison may be achieved using a feedback loop, and when the comparison in the feedback loop is in steady-state meaning that the output frequency and phase are matched to the reference frequency and phase in the error detector, the PLL is locked.

To maintain lock, a significant amount of power is generally consumed by the PLL. One means for reducing the amount of power consumed by PLLs is to turn the PLL off when not needed. In wireless devices, such as mobile telephones, the devices spend much of their time in sleep mode with many circuits in the wireless device turned off. When in sleep mode, wireless devices may operate in a listen or sniff mode with very low active power consumption. In a listen or sniff mode, the wireless device listens for a signal to pull itself out of sleep mode to resume normal operation. However, during listen or sniff mode, power may still be consumed by PLLs as an accurate LO may be needed during listen or sniff functions.

In high frequency wireless communications, a fractional PLL may be used to adjust the output to required high frequency channels, and a fractional PLL may include a feedback divider circuit that consumes a relatively significant amount of power even when the wireless device is in listen or sniff mode. Some PLLs include a voltage controlled oscillator (VCO). Accordingly, some applications may run the VCO of the PLL in an open-loop to avoid the power consumed in the feedback divider circuit. But residual frequency error and elevated phase noise limits the usability of an open loop VCO, and for some wireless communications, an open loop VCO does not provide acceptable results even during listen or sniff operations.

SUMMARY

In some examples, an integrated circuit is provided that includes a fractional PLL configured to run in a divider disabled mode. The fractional PLL may include a phase frequency detector (PFD), charge pump, loop filter, VCO, feedback divider, sigma-delta modulator, a re-timed clock signal based on the VCO output, and/or other suitable components. The feedback divider may be disabled such that the feedback divider circuit of the fractional PLL does not consume power. The re-timed clock signal may be multiplexed with sigma-delta modulation from the sigma-delta modulator. The re-timed clock signal may comprise a plurality of re-timed clock signals. The PFD may determine an error between the re-timed clock signal and a reference clock, and the error between the re-timed clock signal and a reference clock is used to adjust the output of the VCO to achieve lock for the PLL while the feedback divider is disabled.

In some examples, an integrated circuit device includes a first re-timer configured to receive a reference clock signal and a voltage controlled oscillator (VCO) output signal, the first re-timer configured to provide a first re-timed clock signal in response to the reference clock signal and the VCO output signal. The integrated circuit device also includes a first multiplexer configured to receive the first re-timed clock signal and provide a feedback clock signal. The integrated circuit device also includes a phase frequency detector (PFD) configured to receive the feedback clock signal and the reference clock signal and to provide an error signal in response to the feedback clock signal and the reference clock signal. The integrated circuit device also includes a VCO configured to receive a voltage signal based on the error signal, the VCO configured to provide the VCO output signal in response to the voltage signal.

In some examples, an integrated circuit includes a first re-timer that includes a first input coupled to a reference clock, a second input, and an output. The integrated circuit also includes a first multiplexer that includes a first input coupled to the output of the first re-timer, a second input, and an output. The integrated circuit also includes a PFD that includes a first input coupled to the reference clock, a second input coupled to the output of the first multiplexer, and an output. The integrated circuit also includes a charge pump that includes an input coupled to the output of the PFD, and an output. The integrated circuit also includes a filter that includes an input coupled to the output of the charge pump, and an output. The integrated circuit also includes a VCO that includes an input coupled to the output of the filter, and an output coupled to the second input of the first re-timer. The integrated circuit also includes a feedback divider that includes a first input coupled to the output of the VCO, and an output coupled to the second input of the first multiplexer.

In some examples, a method includes receiving, by a re-timer, a reference clock signal and a voltage controlled oscillator (VCO) output signal. The method further includes retiming, by the re-timer, the reference clock signal according to the VCO output signal to produce a re-timed clock signal. The method further includes determining, by a phase frequency detector (PFD), an error signal based on the re-timed clock signal and the reference clock signal. The method further includes modifying the VCO output signal based on the error signal.

BRIEF DESCRIPTION OF THE DRAWINGS

Features of the present invention may be understood from the following detailed description and the accompanying drawings.

DETAILED DESCRIPTION

Figure 1:
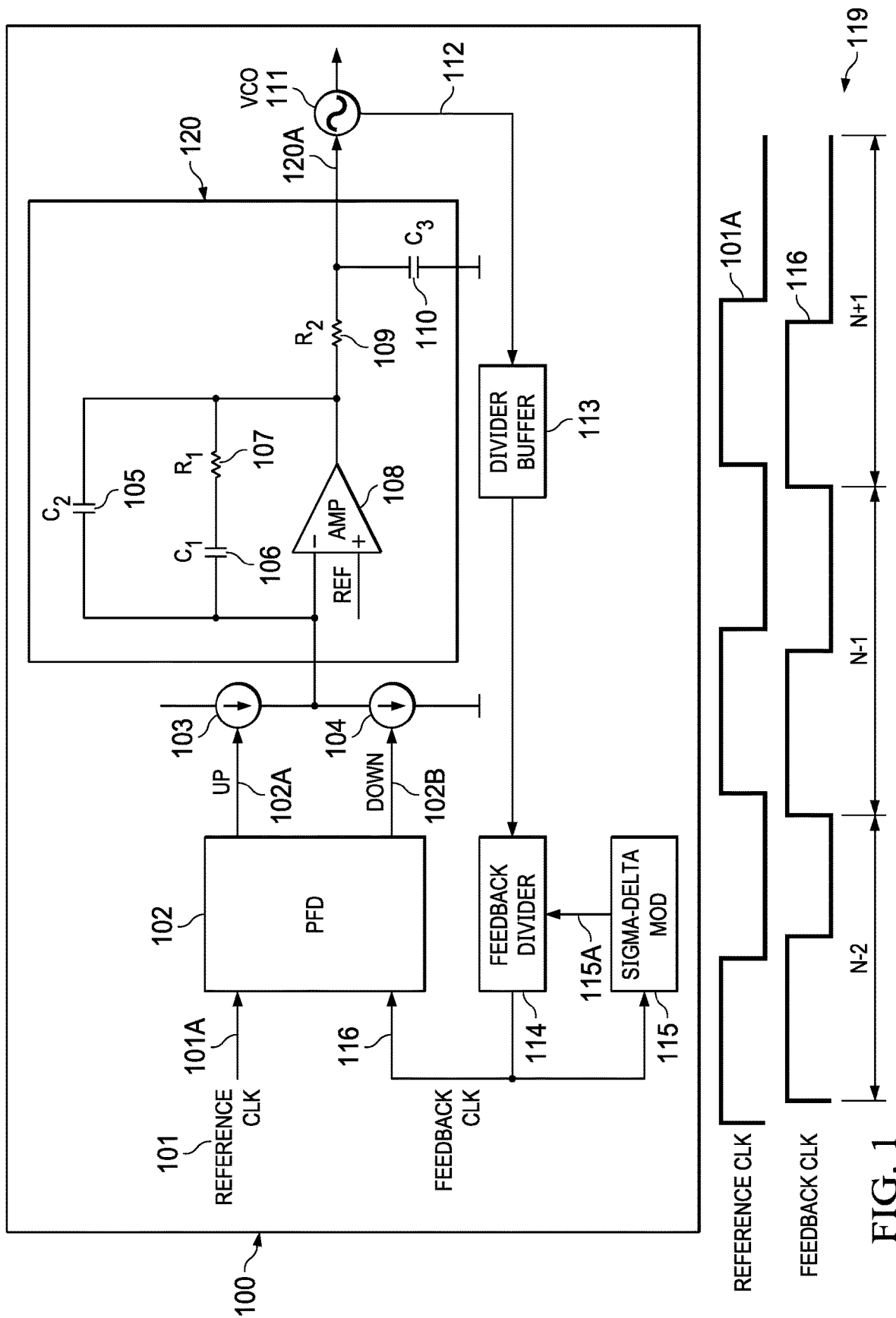
FIG. 1 is a circuit diagram of a LO PLL circuit.

Specific examples are described below in detail with reference to the accompanying figures. It is understood that these examples are not intended to be limiting, and unless otherwise noted, no feature is required for any particular example.

An example LO using a fractional PLL includes a PFD, charge pump, filter, VCO, and divider circuit. The LO compares a reference clock signal to a feedback signal from the feedback divider, and the result of the comparison is used to control the VCO until the PLL comes into lock. The LO may include one or more filters and amplifiers to process the error signal. In addition, the feedback circuit may include a modulator and one or more divider buffers.

A divider circuit may provide the feedback clock signal that is compared to a reference clock signal. In some examples, the divider circuit is disabled. When the divider circuit is disabled, such as by disconnecting the VCO output from the divider circuit, the feedback clock signal may be derived from the phase information of the VCO resulting in a re-timed clock signal. The re-timed clock signal edge brings the phase information of the VCO to the PFD at the correct phase-detection time.

In some examples, the re-timed clock signal can be extended for multiple subsequent clock edges to provide a group of re-timed clock signals. The group of re-timed clock signals can be used for fractional synthesis. In some examples, the divider circuit may include a sigma-delta modulator, and the output of the sigma-delta modulator may be used to randomly select from the group of re-timed clock signals to produce an error signal that drives the VCO output frequency to an integer plus some fractional multiple of the reference frequency.

In these examples and others, the LO demonstrates reduced power consumption when the divider circuit is disabled and demonstrates improved residual frequency error and phase noise.

Of course, these advantages are merely examples, and no advantage is required for any particular embodiment.

Examples of an integrated circuit device with a disabled divider circuit are described with reference to the figures below.

Divider circuits may be associated with fractional synthesis. Fractional N frequency synthesis provides small step sizes (narrow channels) over a large bandwidth without requiring a large division ratio. This overcomes issues associated with the very high division ratios in the digital divider of the phase locked loop of a LO that can occur when very high frequencies are used such as those in wireless communication. Wireless frequencies may be in the gigahertz range. For example, frequency ranges used in wireless communications include the: 900 MHz, 2.4 GHz, 3.6 GHz, 4.9 GHz, 5 GHz, 5.9 GHz and 60 GHz bands. Channel spacing in these frequency bands may be only several kilohertz (e.g., 200 KHz). To divide such high frequencies down to a reference clock signal such as 40 MHz or 80 MHz would require very high division ratios causing performance issues and requiring significant amounts of power.

To achieve small steps between channels at high frequencies, while still offering a reasonable operating frequency, requires a very high division ratio. For example a PLL operating at 10 MHz and requiring a 100 Hz step size will need a division ratio of 100,000. Such a large division ratio impacts the PLL performance because the PLL bandwidth may be around a tenth of the reference comparison frequency. For the above example, that means a PLL bandwidth of only 10 Hz, and this would result in a loss of performance because there would be slow PLL frequency switching, large passive component sizes, and high phase noise at frequencies close to the carrier.

Fractional N synthesis avoids the large division ratio because the divider takes on a fractional division ratio rather than an integer one. To achieve this, the divider alternatives between division ratios. For example, it may change between N, N+1, N−1, and N−2—the proportion of the various division ratios determined to give the required frequency. A division ratio between N, N+1, N−1, and N−2 gives frequencies between four division ratios and is considered a second order modulation. In another example, first order modulation provides a division ratio range of N and N+1 gives frequencies between two division ratios. A third order modulation may provide division ratios between N, N+1, N+2, N+3, N−1, N−2, N−3, and N−4. Additional order modulations may be used. An advantage of using fractional n synthesis is that the step frequency can be small while still allowing a high comparison frequency and loop bandwidth to improve the overall synthesizer performance.

In this regard, FIG. 1 is a circuit diagram of a LO PLL circuit 100 using a fractional PLL with sigma-delta modulation. A reference clock signal 101A is received by PFD 102. The reference clock signal 101A from reference clock 101 is a stable, accurate frequency reference to which the output will be phase locked. Reference clock signal 101A may be derived from a crystal or temperature-controlled crystal oscillator, for example.

PFD 102 compares the feedback clock signal 116 to the reference clock signal 101A and derives phase-error signals 102A and 102B between reference clock signal 101A and feedback clock signal 116. PFD 102 may, for example, comprise two flip-flops coupled with an AND gate.

Charge pumps 103 and 104 convert phase-error signals 102A and 102B into a charge pump output signal comprising a train of positive or negative current pulses in proportion to the phase error. Charge pump 103 may provide an up pulse, and charge pump 104 may provide a down pulse. The duration of the up pulse is proportional to any difference between the reference clock signal 101A and feedback clock signal 116. The duration of the down pulse may be predetermined by the PFD 102. For example, the delay for the down pulse may be defined by internal circuitry in PFD 102 such as inverter delay, etc. When LO PLL circuit 100 using fractional synthesis is locked, the average duration of the up pulses will equal the duration of the down pulses. Using integer N synthesis, lock is achieved when the duration of the up pulses is equal to the duration of the down pulses.

Charge pumps 103 and 104 respond to the phase-error signals 102A and 102B by either pumping current into loop filter 120, or pumping current out of loop filter 120 and into ground. Charge pumps 103 and 104 may be equally weighted current sources.

Loop filter 120 comprises amplifier 108, capacitor $C_1$ 106, resistor $R_1$ 107, capacitor $C_2$ 105, resistor $R_2$ 109, and capacitor $C_3$ 110. Loop filter 120 integrates the current pulses from the charge pumps 103 and 104, providing a clean voltage signal 120A to VCO 111. Furthermore, the active loop filter topology using op amp 108 enables loop filter 120 to reach higher tuning voltages while ensuring good bias margins for the charge pump current sources. The active filter comprises amplifier 108, capacitor $C_1$ 106, resistor $R_1$ 107, capacitor $C_2$ 105, and the active filter controls voltage signal 120A. Capacitor $C_2$ 105 filters high frequency noise spurs caused by sampling. Resistor $R_1$ 107 provides stability by isolating the phase correction component of the error signal from the frequency correction component. The passive low pass filter comprises resistor $R_2$ 109, and capacitor $C_3$ 110 for rejecting high frequency jitter.

Voltage signal 120A from loop filter 120 drives VCO 111. VCO 111 outputs a frequency based on the voltage signal 120A. For example, when the voltage signal 120A goes up, the frequency of VCO 111 may increase, and when the voltage signal 120A goes down, the frequency of VCO 111 may decrease. VCO output 112 is fed back on LO PLL circuit 100.

In the feedback loop of LO PLL circuit 100, VCO output 112 is received by divider buffer 113. The output of divider buffer 113 is received by feedback divider 114. Feedback divider 114 also receives modulation signal 115A from sigma-delta modulator 115. The feedback divider 114 functions as an adjustable frequency divider, and the control for the feedback divider 114 is provided by modulation signal 115A from sigma-delta modulator 115. The sigma-delta modulator 115 provides a density of pulses, and the density of the pulses represents the average value of the signal over a specific period. The modulation signal 115A from sigma-delta modulator 115 is the divider modulus for feedback divider 114 that enables fractional N synthesis. Feedback clock signal 116 is provided to sigma-delta modulator 115 and to PFD 102, where the process begins again.

Fractional synthesis in FIG. 1 can be explained with the following example: In a PLL that can be tuned from 2.402 GHz to 2.480 GHz in steps of 1 MHz that has a reference clock of 19.68 MHz, when the divider modulus N is set to 122, the PLL outputs 2.40096 GHz and when the divider modulus N is set to 123, the PLL outputs 2.42064 GHz. If the desired output is 2.403 GHz, then the divider modulus N would need to be a non-integer value between 122 and 123. This cannot be implemented directly because the divider modulus must be an integer value. However the divider modulus can be updated each reference period, so switching between N=122 and N=123 such that the average modulus over many reference periods converges to the desired N value between 122 and 123. The modulation from sigma-delta modulator 115 provides the average modulus to converge on the desired N value.

An exemplary timing diagram is shown in FIG. 1 for reference clock signal 101A and feedback clock signal 116. In this example, the modulation order from the sigma-delta modulator 115 is N, N+1, N−1, and N−2, giving frequencies between four division ratios. Only N−2, N−1, and N+1 are shown in FIG. 1. The timing diagram in FIG. 1 discloses the difference between reference clock signal 101A and feedback clock signal 116 over three division ratios.

In the LO PLL circuit 100 of FIG. 1, the divider circuit comprising the feedback divider 114, divider buffer 113, and sigma-delta modulator 115 consume most of the power in the PLL. For example, LO PLL circuit 100 may consume approximately 7 mA of power, but the divider circuit may consume approximately 4 mA of the 7 mA.

Figure 2A:
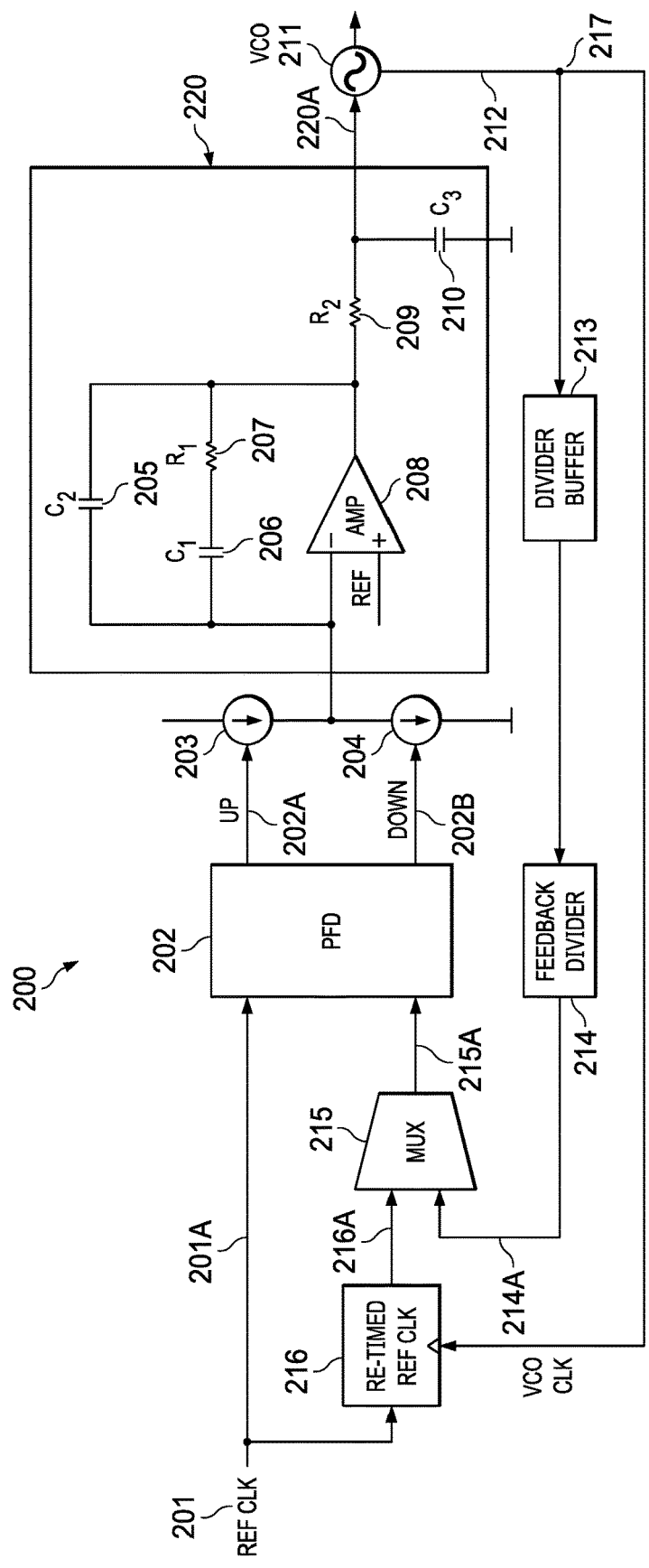
FIG. 2A is a circuit diagram of a LO PLL circuit according to some aspects of the present disclosure.

FIG. 2A is a circuit diagram of a LO PLL circuit 200 according to some aspects of the present disclosure. A reference clock signal 201A is received by PFD 202. The reference clock signal 201A from reference clock 201 is a stable, accurate frequency reference to which the output will be phase locked. Reference clock signal 201A may be derived from a crystal or temperature-controlled crystal oscillator, for example. Clock reference 201 is received by re-timer 216. Re-timer 216 also receives VCO output signal 212. Re-timer 216 generates a re-timed clock signal 216A that brings the phase information of VCO 211 to PFD 202 at the correct phase detection time. For example, re-timer 216 latches when the reference clock 201 is high and VCO output signal 212 goes high. Similarly, re-timed clock signal 216A, for example, goes low when the reference clock signal 201A is low and VCO output signal 212 goes low. As a result, the phase information from VCO 211 is captured and comprises re-timed clock signal 216A, which may be used in the feedback loop to tune the output of VCO 211. The function of re-timer 216 is further explained below with respect to FIG. 2B.

Re-timed clock signal 216A is provided to multiplexer 215. Multiplexer 215 also receives a feedback divider signal 214A from feedback divider 214. Multiplexer 215 selects between re-timed clock signal 216A and feedback divider signal 214A. In an example, when feedback divider 214 is disabled, multiplexer output 215A comprises re-timed clock signal 216A. In an example, when feedback divider 214 is enabled, multiplexer output 215A comprises the feedback divider signal 214A.

PFD 202 receives the reference clock signal 201A and multiplexer output 215A. PFD 202 compares multiplexer output 215A to reference clock signal 201A and derives the phase-error signal between multiplexer output 215A and reference clock signal 201A. As described above with respect to FIG. 1, charge pumps 203 and 204 convert phase-error signals 202A and 202B from PFD 202 into a train of positive or negative current pulses in proportion to the phase-error. The current pulses from charge pumps 203 and 204 are filtered by the loop filter 220 comprising amplifier 208, capacitor $C_1$ 206, resistor $R_1$ 207, capacitor $O_2$ 205, resistor $R_2$ 209, and capacitor $C_3$ 210. Voltage signal 220A from loop filter 220 is input to VCO 211 to control the VCO output signal 212 as described with respect to FIG. 1. In an example, the loop filter 220 may comprise fewer components than those listed here. For example, the loop filter 220 may exclude a passive filter comprising resistor $R_2$ 209, and capacitor $C_3$ 210.

In an example, LO PLL circuit 200 may include a means for disabling feedback divider 214 and operating the LO PLL circuit in a divider disabled mode. Feedback divider 214 may be disabled to save power. For example, when a wireless device is in sleep mode, the wireless device may enter a low power operation mode or sniff/listen mode to conserve power. In low power operation mode or sleep mode, the LO PLL circuit 200 may disable the feedback divider 214. Then, in one example, a signal may be received indicating that the wireless device is to "wake-up" and receive a message, so the divider disabled mode will be turned off or disengaged to enable the feedback divider 214 to resume normal operation. The feedback divider 214 may be disabled by, for example, a switch at node 217 to switch the VCO output signal 212 between feedback divider 214 and re-timer 216. A signal received by the LO PLL circuit 200 or at a switch may indicate that the LO PLL circuit 200 is to operate in a divider disabled mode by, for example, switching the VCO output signal 212 to re-timer 216. In another example, the feedback divider 214 may be disabled using a buffer or inverter (not shown) between the divider buffer 213 and node 217. In an example, the buffer or inverter may include an output enable function that receives a signal to operate in a divider disabled mode that may be used to disable VCO output signal 212 from being received by divider buffer 213 and feedback divider 214. This effectively disables the feedback divider 214 and divider buffer 213. In an example, a buffer or inverter may be placed between re-timer 216 and node 217 to disable or enable VCO output signal 212 to re-timer 216. These are exemplary means by which feedback divider 214 can be disabled to conserve power and are not limiting to the current disclosure. Any means which controls the VCO output signal 212 to feedback divider 214 is contemplated. The means for disabling the feedback divider 214 may be controlled by software, hardware, or a combination of hardware and software.

In an embodiment, when LO PLL circuit 200 is in listen or sniff mode, feedback divider 214 may be operated in a divider disabled mode disabled using any one or more of the above means, thereby saving energy. When feedback divider 214 is disabled, LO PLL circuit 200 is configured, for example by the means described above, so that VCO output signal 212 may be received by re-timer 216.

Figure 2B:
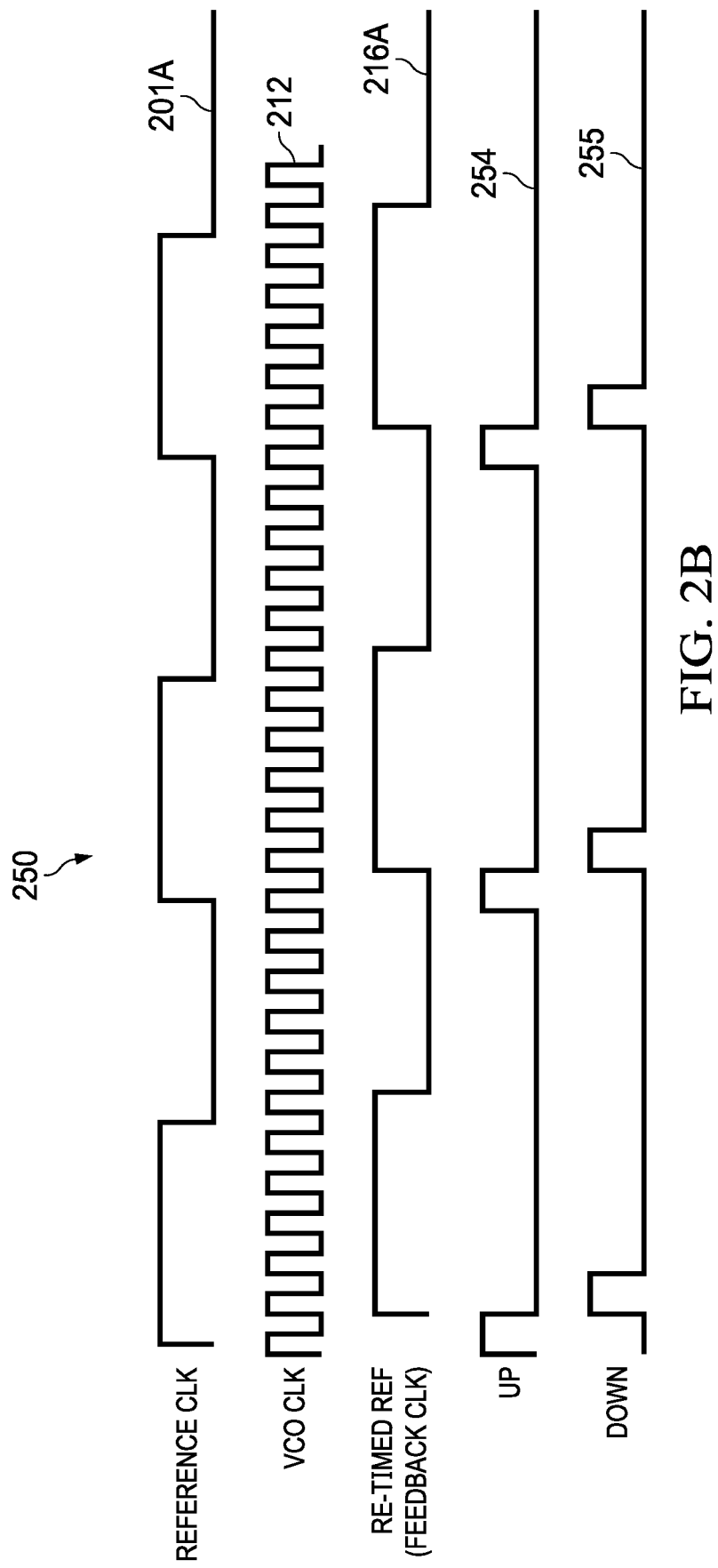
FIG. 2B is a timing diagram according to some aspects of the present disclosure.

FIG. 2B is a timing diagram 250 according to some aspects of the present disclosure. Timing diagram 250 discloses reference clock signal 201A, VCO output signal 212, re-timed clock signal 216A, up pulse signal 254, and down pulse signal 255. In an example, the reference clock signal 201A is slower than the VCO output signal 212.

Re-timer 216 receives the reference clock signal 201A from clock reference 201 and VCO output signal 212 from VCO 211. Re-timer 216 outputs re-timed clock signal 216A. Re-timer 216 may comprise one or more latches. When the reference clock signal 201A goes high and the VCO output signal 212 goes high, re-timer 216 latches the VCO output signal 212, and re-timed clock signal 216A from re-timer 216 goes high. When the reference clock signal 201A goes low and the VCO output signal 212 goes low, then the re-timed clock signal 216A from re-timer 216 goes low.

Referring now to up pulse signal 254, an up pulse is triggered when the reference clock signal 201A goes high, and the up pulse goes low when the re-timed clock signal 216A goes high. Thus, the width of up pulse signal 254 is proportional to the phase difference between the reference clock signal 201A and the re-timed clock signal 216A.

Referring now to down pulse signal 255, in an example, PFD 202 predefines the width of a down pulse signal. For example, the components of the PFD 202 such as, but not limited to, inverters may define down pulse signal 255. In an example, the down pulse signal 255 may be defined by other hardware, software, or a combination of hardware and software.

In an integer N synthesis, when the width of the up pulse signal 254 equals the width of the down pulse signal 255, LO PLL circuit 200 is locked.

Figure 3A:
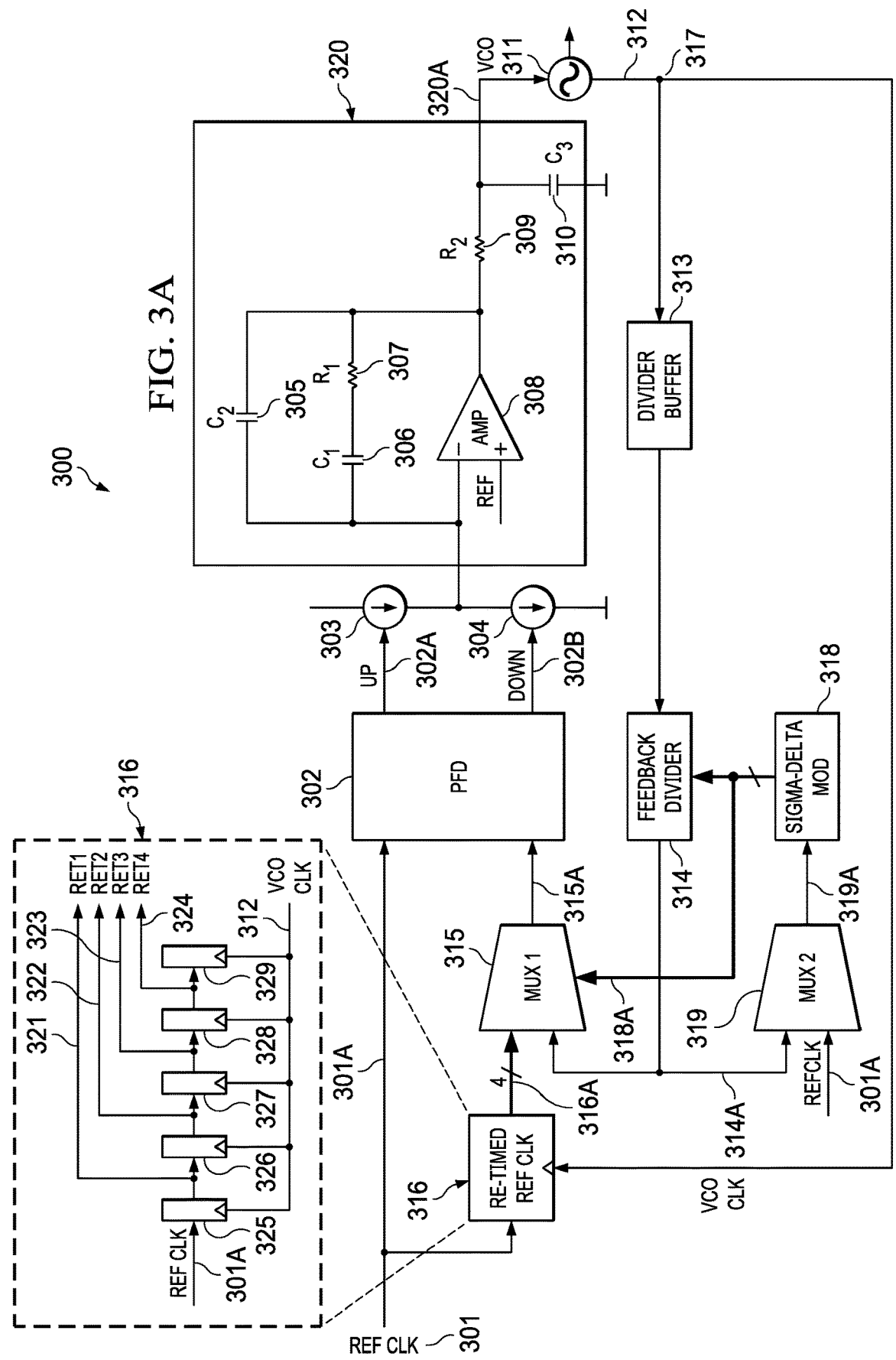
FIG. 3A is a circuit diagram of a LO PLL circuit according to some aspects of the present disclosure.

FIG. 3A is a circuit diagram of a LO PLL circuit 300 using factional synthesis according to some aspects of the present disclosure. LO PLL circuit 300 includes re-timer 316, which may provide one or more re-timed clock signals. In an example, re-timer 316 provides first re-timed clock signal 321, second re-timed clock signal 322, third re-timed clock signal 323, and fourth re-timed clock signal 324, each having subsequent edges based on VCO output signal 312. In an example, the second re-timed clock signal 322 may be delayed by one cycle of VCO output signal 312; the third re-timed clock signal 323 may be delayed by two cycles of VCO output signal 312; and the fourth re-timed clock signal 324 may be delayed by three cycles of VCO output signal 312. The one or more re-timed clock signals may be delayed by any amount, and the above examples are not limiting.

To generate re-timed clock signals 321, 322, 323, and 324, re-timer 316 receives reference clock signal 301A from reference clock 301 and VCO output signal 312 from VCO 311. In this example, re-timer 316 may represent four re-timers. In other examples, re-timer 316 may represent more or less re-timers. Returning to FIG. 3A, reference clock signal 301A may be applied serially to the four re-timers of re-timer 316 such that each receive VCO output signal 312 in turn. The delay caused by the serial connection of reference clock signal 301A going through each re-timer provides subsequent delayed re-timed clock signals 321, 322, 323, and 324 (collectively re-timed clock signals 316A) from re-timer 316. The serial connection in FIG. 3A, for example, discloses reference clock signal 301A received by re-timer 325. Then re-timed clock signal 321 from re-timer 325 is provided to re-timer 326. Re-timer 326 outputs re-timed clock signal 322, which is received by re-timer 327, and re-timer 327 outputs re-timed clock signal 323. Re-timed clock signal 323 is received by re-timer 328, which outputs re-timed clock signal 324. Re-timed clock signal 324 is received by re-timer 329. Each re-timer 325-329 may provide a different effect in on the respective received incoming re-timed clock signal. Re-timers 325-329 may respectively delay or increase timing.

Each of the re-timed clock signals 316A is determined as explained above with respect to FIGS. 2A and 2B. When reference clock signal 301A goes high and VCO output signal 312 goes high, then the re-timed clock signal goes high, and when reference clock signal 301A goes low and VCO output signal 312 goes low, then the re-timed clock signal goes low. As described above, because the reference clock signal 301A is received serially between the one or more re-timers of re-timer 316, the re-timed clock signals 316A of re-timer 316 may be delayed yielding multiple subsequent clock edges received by multiplexer 315.

Multiplexer 315 receives re-timed clock signals 316A as well as feedback divider signal 314A. In addition, multiplexer 315 receives a modulation signal 318A from sigma-delta modulator 318. In an example, the modulation signal 318A is a sigma-delta modulation signal. While the example in FIG. 3A discloses sigma-delta modulator 318, this disclosure is not limited to sigma-delta modulation, and other modulators, or the like may be used to achieve fractional synthesis.

In an example in which the fractional synthesis uses second order modulation, there are four re-timed clock signals, and modulation signal 318A comprises four sigma-delta modulation signals that are received by multiplexer 315. In an example, modulation signal 318A may comprise modulations based on division rations between N−1, N+1, N, and N−2. The present disclosure may be used with different order modulation.

Multiplexer 319 receives feedback divider signal 314A and reference clock signal 301A. In an example, multiplexer 319 outputs modulator input signal 319A to sigma-delta modulator 318. Modulator input signal 319A operates as a clock signal for sigma-delta modulator 318. Multiplexer 319 enables the sigma-delta modulator 318 to continue providing modulation signal 318A to multiplexer 315 when feedback divider 314 is disabled. For example, when feedback divider 314 is enabled, modulator input signal 319A comprises feedback divider signal 314A. When feedback divider 314 is disabled, modulator input signal 319A comprises reference clock signal 301A. Thus, the LO PLL circuit 300 will continue to function when feedback divider 314 is disabled.

Re-timed clock signals 316A are provided to multiplexer 315. Multiplexer 315 also receives feedback divider signal 314A from feedback divider 314. Multiplexer 315 selects between re-timed clock signals 316A and feedback divider signal 314A. When feedback divider 314 is disabled, multiplexer 315 outputs one of the re-timed clock signals 321, 322, 323, and 324. As will be more fully explained with respect to FIG. 3B below, multiplexer 315 outputs the re-timed clock signal (321, 322, 323, and 324) that aligns with the correct edge of the modulation signal 318A.

PFD 302 receives the reference clock signal 301A and multiplexer output 315A from multiplexer 315. PFD 302 compares the reference clock signal 301A and multiplexer output 315A and derives the phase-error signal between the reference clock signal 301A and multiplexer output 315A. As described above with respect to FIG. 1, charge pumps 303 and 304 convert the phase-error signals 302A and 302B from PFD 302 into a train of positive or negative current pulses in proportion to the phase-error. The current pulses from charge pumps 303 and 304 are filtered by the loop filter 320 comprising amplifier 308, capacitor $C_1$ 306, resistor $R_1$ 307, capacitor $C_2$ 305, resistor $R_2$ 309, and capacitor $C_3$ 310. Voltage signal 320A from loop filter 320 is input to VCO 311 to control the frequency and phase of the VCO output signal 312 as described with respect to FIG. 1. In an example, the loop filter 320 may comprise fewer components than those listed here. For example, the loop filter 320 may exclude a passive filter comprising resistor $R_2$ 309, and capacitor $C_3$ 310.

In an example, LO PLL circuit 300 may include a means for disabling feedback divider 314. For example, a switch at node 317 may be used to switch the VCO output signal 312 between feedback divider 314 and re-timer 316. In another example, the feedback divider 314 may be disabled using a buffer or inverter (not shown) between the divider buffer 313 and node 317. In an example, the buffer or inverter may include an output enable function that may be used to disable VCO output signal 312 from being received by divider buffer 313 and feedback divider 314, which effectively disables the feedback divider 314 and divider buffer 313. In an example, a buffer or inverter may be placed between re-timer 316 and node 317 to disable or enable VCO output signal 312 to re-timer 316. These are exemplary means by which feedback divider 314 can be disabled to conserve power and are not limiting to the current disclosure. Any means which controls the VCO output signal 312 to feedback divider 314 is contemplated. The means for disabling the feedback divider 314 may be controlled by software, hardware, or a combination of hardware and software.

In an embodiment, when LO PLL circuit 300 is in listen or sniff mode, feedback divider 314 may be disabled using any one or more of the above means, thereby saving energy. When feedback divider 314 is disabled, LO PLL circuit 300 is configured, for example by the means described above, so that VCO output signal 312 is received by re-timer 316.

Figure 3B:
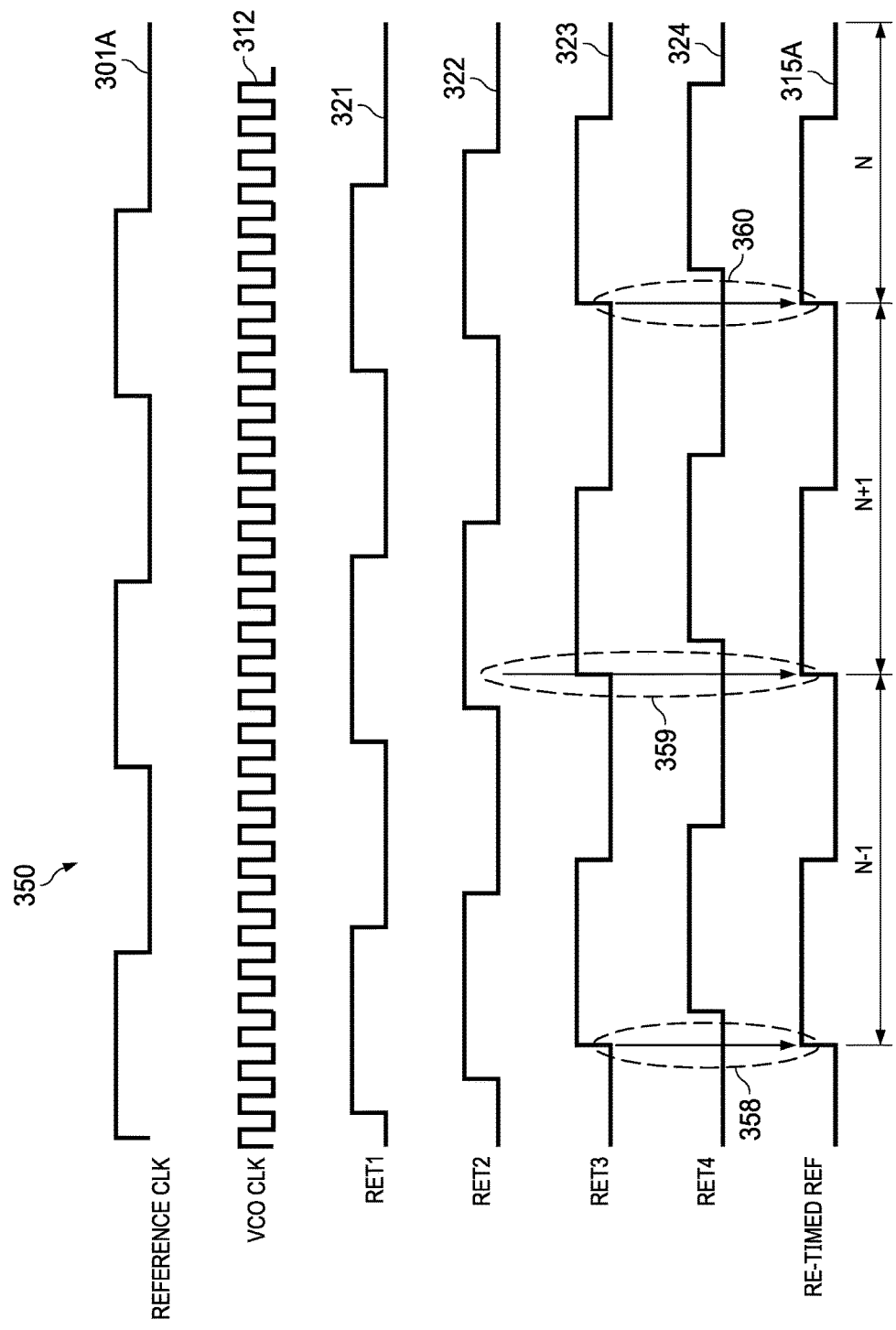
FIG. 3B is a timing diagram according to some aspects of the present disclosure.

FIG. 3B is a timing diagram 350 according to some aspects of the present disclosure showing reference clock signal 301A and VCO output signal 312. In an example with second order modulation in which the sigma-delta modulator 318 alternates the N counter between four different numbers, VCO output signal 312 is delayed in re-timer 316 to produce re-timed clock signals 321, 322, 323, and 324. Each re-timed clock signal may be subsequently delayed by an equal amount or other amount, as discussed above.

For each sigma-delta modulation value (N−1, N−2, N, N+1) in FIG. 3B, the re-timed clock signal whose edge aligns with the corresponding sigma-delta modulation may be output to PFD 302 when feedback divider 314 is disabled. Referring to FIG. 3B, in an example, for N−1, the correct edge 358 is that of re-timed clock signal 323, so multiplexer output 315A comprises retimed clock signal 323. For N+1, the correct edge 359 is that of re-timed clock signal 322, so multiplexer output 315A comprises retimed clock signal 322. For N, the correct edge 360 is again that of re-timed clock signal 323, so multiplexer output 315A comprises retimed clock signal 322. Through this process, fractional synthesis can be carried out when feedback divider 314 is disabled because re-timed clock signals 321, 322, 323, and 324 maintain the phase information of VCO output signal 312. Additionally, VCO output signal 312 to re-timer 316 can be disabled after the generation of re-timed clock signal 324 and re-enabled when the reference clock signal 301A turns high to save power consumption in the re-timer 316.

Figure 4:
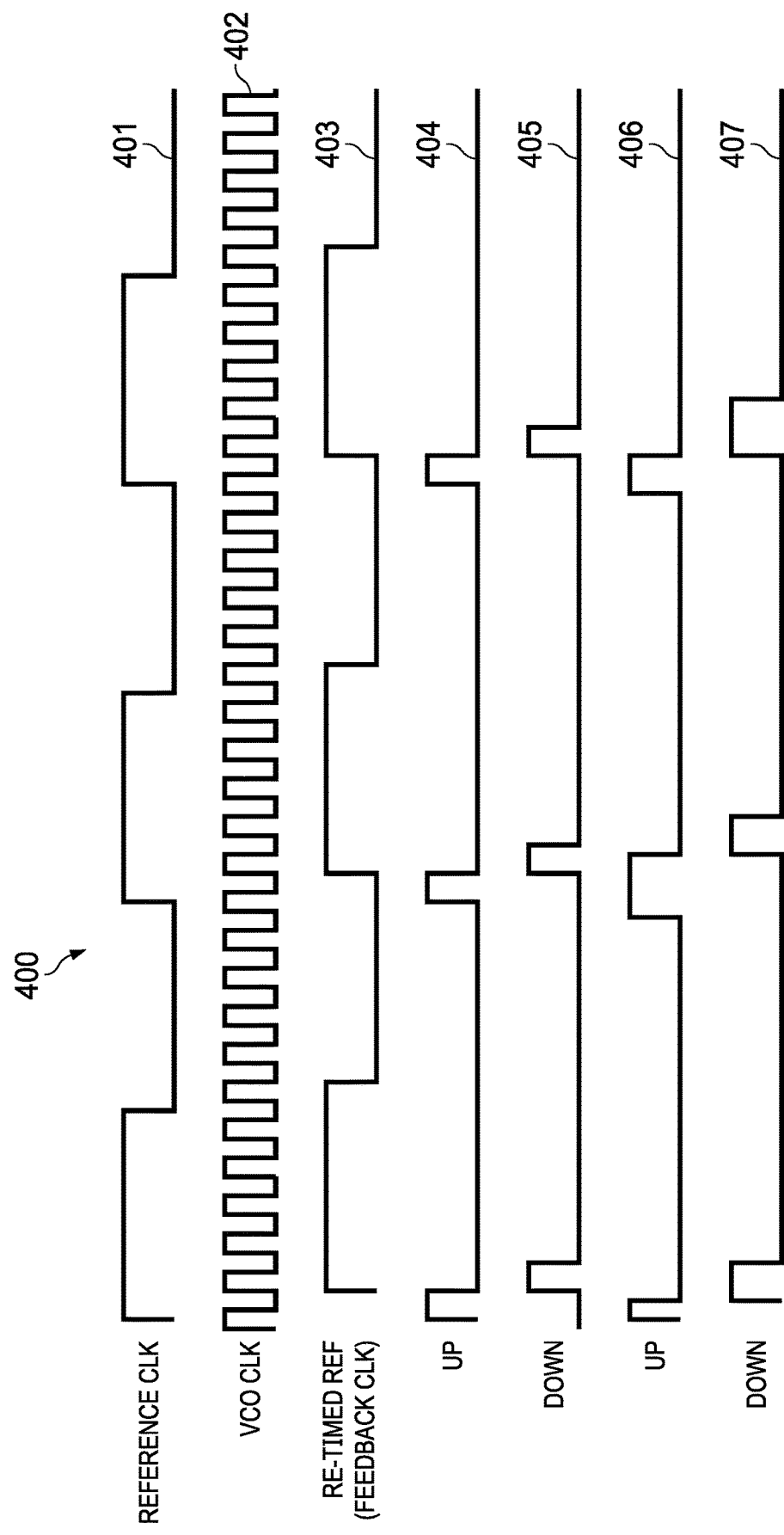
FIG. 4 is a timing diagram according to some aspects of the present disclosure.

FIG. 4 is a timing diagram 400 according to some aspects of the present disclosure that illustrates the difference between the fractional synthesis described above with respect to FIGS. 3A and 3B and integer synthesis. FIG. 4 shows reference clock signal 401, VCO output signal 402, and a re-timed clock signal 403, as discussed above with respect to FIGS. 2B and 3B. In integer synthesis, lock is achieved by the PLL in the LO when the width of the up pulse train 404 equals the width of the down pulse train 405. With the fractional synthesis disclosed with respect to FIGS. 3A and 3B, lock is achieved by the PLL in the LO when the average width of the up pulse train 406 equals the width of the down pulse train 407.

Figure 5:
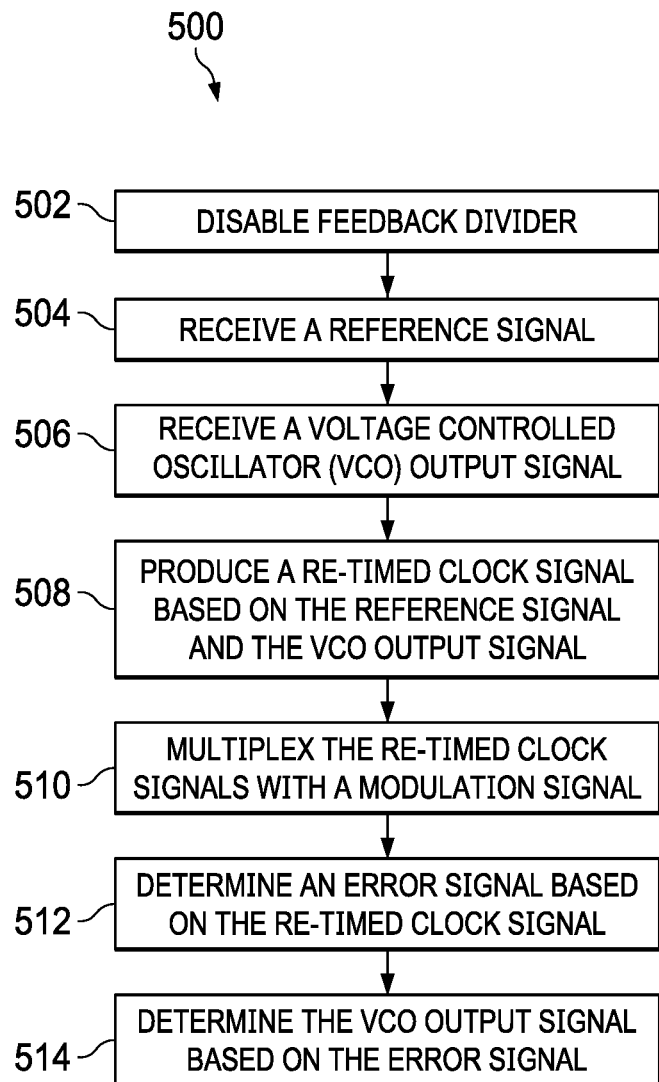
FIG. 5 is a flow diagram of a method of performing local oscillation according to some aspects of the present disclosure.

Operation of the receiver is further described with reference to FIGS. 2A, 3A, and 5. FIG. 5 is a flow diagram of a method 500 of performing local oscillation according to some aspects of the present disclosure. The method 500 is suitable for performing by the LO PLL circuit 200 of FIG. 2 and the LO PLL circuit 300 of FIG. 3 or other suitable integrated circuit. Processes of the method 500 may be performed in orders other than described, and processes may be performed concurrently in parallel. Furthermore, processes of the method 500 may be omitted or substituted in some examples of the present disclosure.

Referring to block 502, FIGS. 2A and 3A, the feedback divider 314 in LO PLL circuit 300 and the feedback divider 214 in LO PLL circuit 200 may be disabled. Feedback dividers 314 and 214 may be disabled by any one or more of the means previously discussed above with respect to FIGS. 2A and 3A, including the use of switches or other logic circuitry that disconnects feedback dividers 314 and 214 and divider buffers 313 and 213 from VCO output signals 312 and 212, respectively. Additional hardware, software, and/or a combination of hardware and software may be used to disable feedback dividers 314 and 214 and divider buffers 313 and 213 so that they do not use power.

Referring to block 504, FIGS. 2A and 3A, reference clock signal 201A is received by re-timer 216 in FIG. 2A, and reference clock signal 301A is received by re-timer 316 in FIG. 3A.

Referring to block 506, re-timers 316 and 216 receive VCO output signal 312 and VCO output signal 212 respectively.

Referring to block 508 and FIG. 3A, re-timer 316 produces re-timed clock signal 316A. As described above with respect to FIG. 3A, re-timed clock signal 316A may comprise re-timed clock signals 321, 322, 323, and 324, each having subsequent edges based on VCO output signal 312.

When the reference clock signal 301A goes high and VCO output signal 312 goes high, then the re-timed signal goes high, and when reference clock signal 301A goes low and VCO output signal 312 goes low, then the re-timed signal goes low. As described above, because the reference clock signal 301A is received serially between the one or more re-timers of re-timer 316, the output of re-timer 316 may be delayed yielding multiple subsequent VCO clock edges that are used to determine the error between selected clock edge of VCO output signal 312 and reference clock signal 301A in the fractional synthesis process disclosed herein.

Referring to block 508 and FIG. 2A, re-timer 216 produces re-timed clock signal 216A that brings the phase information of VCO 211 to PFD 202 at the correct phase detection time. For example, re-timer 216 latches when the reference clock signal 201A is high and VCO output signal 212 goes high. Similarly, the re-timed clock signal 216A, for example, goes low when the reference clock signal 201A is low and VCO output signal 212 goes low. The result is a re-timed clock signal 216A produced by re-timer 216 based on reference clock signal 201A and VCO output signal 212.

Referring to block 510 and FIGS. 3A and 3B, multiplexer 315 receives the re-timed clock signals 316A from re-timer 316 as well as modulation signal 318A from sigma-delta modulator 318. The modulation signal 318A is multiplexed with re-timed clock signals 316A from re-timer 316, and the re-timed clock signal 321, 322, 323, or 324 that aligns with the correct edge of the modulation signal 318A is produced by multiplexer 315 as multiplexer output 315A that is received by PFD 302.

Referring to block 512, FIGS. 2A and 3A, an error signal is determined based on the re-timed clock signal. In FIG. 2A, PFD 202 receives the reference clock signal 201A and the multiplexer output 215A. PFD 202 compares the reference clock signal 201A and the multiplexer output 215A and derives phase-error signals 202A and 202B between reference clock signal 201A and multiplexer output 215A. In FIG. 3A, PFD 302 receives the reference clock signal 301A and multiplexer output 315A. PFD 302 compares the reference clock signal 301A and multiplexer output 315A and derives phase-error signals 302A and 302B between the reference clock signal 301A and multiplexer output 315A.

Referring to block 514, FIGS. 2A and 3A, the phase-error signal between the reference clock signals and the re-timed clock signals based on the VCO output signals are used to adjust the VCO and thereby adjust the frequency and phase of the VCO output signal. In an example, the phase-error signal from the PFD may be amplified and filtered as discussed above. Referring to FIG. 2A, voltage signal 220A represents the phase-error, and voltage signal 220A controls the VCO output signal 212 as described with respect to FIG. 1. Referring to FIG. 3A, voltage signal 320A represents the phase-error, and voltage signal 320A controls the VCO output signal 312 as described with respect to FIG. 1.

LO PLL circuits 200 and 300 or other integrated circuit device may perform the processes of the method 500 using any combination of dedicated hardware and instructions stored in a non-transitory medium. Accordingly, elements of LO PLL circuits 200 and 300 may include a processing resource coupled to a non-transitory computer-readable medium. The processing resource may include one or more microcontrollers, ASICs, CPUs, GPUs, and/or other processing resources configured to execute instructions stored on the medium. Examples of suitable non-transitory computer-readable media include one or more flash memory devices, battery-backed RAM, SSDs, HDDs, optical media, and/or other memory devices suitable for storing the instructions for the processing resource.

It is understood that the present disclosure provides a number of exemplary embodiments and that modification are possible to these embodiments. Such modifications are expressly within the scope of this disclosure. Furthermore, application of these teachings to other environments, applications, and/or purposes is consistent with and contemplated by the present disclosure.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

What is claimed is:

1. A circuit comprising:
    a phase lock loop (PLL) including:
        a first PLL input;
        a second PLL input; and
        a voltage controlled oscillator (VCO) having a VCO output signal; and
    a re-timer circuit having a re-timer output coupled to the second PLL input, and a re-timer input coupled to the VCO output signal.

2. The circuit of claim 1, wherein:
    the first PLL input is configured to receive a reference clock signal; and
    the re-timer circuit is configured to receive the reference clock signal.

3. The circuit of claim 2, wherein:
    the re-timer circuit is configured to output a first re-timed clock signal in response to receiving the reference clock signal and the VCO output signal.

4. The circuit of claim 1, wherein:
    the PLL includes a feedback divider circuit having a feedback divider circuit input coupled to the VCO output signal and a feedback divider circuit output.

5. The circuit of claim 4, further comprising:
    a multiplexer having a first multiplexer input coupled to the re-timer output, a second multiplexer input coupled to the feedback divider circuit output, and a multiplexer output coupled to the PLL.

6. The circuit of claim 4, wherein:
    the feedback divider circuit includes a feedback buffer and a divider.

7. The circuit of claim 4, wherein:
    the feedback divider circuit is configured to be disabled.

8. The circuit of claim 7, wherein:
    the feedback divider circuit is configured to be disabled in response to a low power operation mode.

9. The circuit of claim 1 wherein:
    the re-timer circuit is configured to output a plurality of re-timed clock signals on the re-timer output.

10. A method comprising:
    receiving, by a phase lock loop (PLL), a power operation signal; and
    in response to the power operation signal indicating low power operation:
        disabling, by the PLL, a feedback divider circuit coupled to an output of a voltage controlled oscillator (VCO) of the PLL;

receiving, by the VCO, an error signal based on a re-timed clock signal, wherein the re-timed clock signal is based on a reference clock signal and the output of the VCO; and outputting, by the VCO, a PLL output signal based on the error signal.

11. The method of claim 10, wherein:

the re-timed clock signal includes:
- a first re-timed clock signal based on the reference clock signal and the output of the VCO;
- a second re-timed clock signal based on the reference clock signal and the output of the VCO;
- a third re-timed clock signal based on the reference clock signal and the output of the VCO; and
- a fourth re-timed clock signal based on the reference clock signal and the output of the VCO.

12. The method of claim 11, wherein:

the first re-timed clock signal, the second re-timed clock signal, the third re-timed clock signal, and the fourth re-timed clock signal are each delayed by different numbers of clock cycles of the reference clock signal.

13. The method of claim 10, wherein:

the feedback divider circuit is coupled a multiplexer.

14. The method of claim 13, wherein:

the re-timed clock signal is output by the multiplexer to the PLL.

15. The method of claim 14, wherein:

the error signal corresponds to a phase error of the PLL output signal.

* * * * *